(12) United States Patent
Coutu

(10) Patent No.: US 7,242,593 B2
(45) Date of Patent: Jul. 10, 2007

(54) THERMALLY EFFICIENT MOTOR HOUSING ASSEMBLY

(75) Inventor: David Coutu, East Hampton, CT (US)

(73) Assignee: IMS Inc., Marlborough, CT (US)

( * ) Notice: Subject to any disclaimer, the term of this patent is extended or adjusted under 35 U.S.C. 154(b) by 4 days.

(21) Appl. No.: 11/176,904

(22) Filed: Jul. 8, 2005

(65) Prior Publication Data

US 2007/0008707 A1    Jan. 11, 2007

(51) Int. Cl.
*H05K 7/14* (2006.01)
*H05K 7/18* (2006.01)

(52) U.S. Cl. .................. 361/800; 361/715; 361/703

(58) Field of Classification Search .............. 361/715, 361/800, 701–703

See application file for complete search history.

(56) References Cited

U.S. PATENT DOCUMENTS

| | | | |
|---|---|---|---|
| 5,946,192 A * | 8/1999 | Ishigami et al. | 361/704 |
| 6,697,256 B1 * | 2/2004 | Horng et al. | 361/704 |
| 2003/0150605 A1 * | 8/2003 | Belady et al. | 165/185 |

* cited by examiner

*Primary Examiner*—Tuan T. Dinh
*Assistant Examiner*—Hung S. Bui

(57) ABSTRACT

A thermally efficient motor housing assembly including a plurality of transistors and a printed wire board (pwb) for controlling a stepper motor and also including a plunger array and a spring array along with a combined heat sink and pwb enclosure.

2 Claims, 2 Drawing Sheets

THERMALLY EFFICIENT MOTOR HOUSING ASSEMBLY

BACKGROUND OF THE INVENTION

Stepper motors such as described in U.S. Pat. No. 5,369,324 entitled "Electrical Stepper Motor" often contain power transistors within the motor control circuit. Since the power transistors generate heat upon operation of the associated stepper motor, heat sinks are required to prevent the stepper motor and motor control circuit from overheating.

In some electric circuits containing power transistors, a heat sink is attached to the power transistor by means of a spring clip arrangement to insure close contact between the power transistor and the heat sink for efficient heat transfer away from the power transistor, per se. One example of a spring clip arrangement is found in U.S. Pat. No. 5,671,118 entitled "Heat Sink and Retainer for Electronic Integrated Circuits"

When the power transistor is arranged within an electrical enclosure, a heat sink in the form of a metal support plate is arranged on the bottom of the enclosure to allow air flow access to the heat sink. One example of such an arrangement is found in U.S. Pat. No. 6,249,435 entitled "Thermally Efficient Motor Controller Assembly".

The attachment of the power transistors to the heat sink within an electrical enclosure is complicated when the heat sink is part of the enclosure, per se.

One purpose of the instant invention is to provide an electrical stepper motor enclosure whereby the power transistors employed within the motor control circuit automatically become spring-loaded into contact with a heat sink, which serves as the power transistor enclosure, upon attachment of the enclosure to the stepper motor support housing.

BACKGROUND OF THE INVENTION

Stepper motors such as described in U.S. Pat. No. 5,369,324 entitled "Electrical Stepper Motor" often contain power transistors within the motor control circuit. Since the power transistors generate heat upon operation of the associated stepper motor, heat sinks are required to prevent the stepper motor and motor control circuit from overheating.

In some electric circuits containing power transistors, a heat sink is attached to the power transistor by means of a spring clip arrangement to insure close contact between the power transistor and the heat sink for efficient heat transfer away from the power transistor, per se. One example of a spring clip arrangement is found in U.S. Pat. No. 5,671,118 entitled "Heat Sink and Retainer for Electronic Integrated Circuits"

When the power transistor is arranged within an electrical enclosure, a heat sink in the form of a metal support plate is arranged on the bottom of the enclosure to allow air flow access to the heat sink. One example of such an arrangement is found in U.S. Pat. No. 6,249,435 entitled "Thermally Efficient Motor Controller Assembly".

The attachment of the power transistors to the heat sink within an electrical enclosure is complicated when the heat sink is part of the enclosure, per se.

One purpose of the instant invention is to provide an electrical stepper motor enclosure whereby the power transistors employed within the motor control circuit automatically become spring-loaded into contact with a heat sink, which serves as the power transistor enclosure, upon attachment of the enclosure to the stepper motor support housing.

SUMMARY OF THE INVENTION

A thermally efficient motor housing assembly including a plurality of transistors and a printed wire board (pwb) for controlling a stepper motor and also including a plunger array and a spring array along with a combined heat sink and pwb enclosure. Attachment of the combined heat sink and pwb enclosure to the motor housing with the plunger and spring array intermediate the the pwb and the motor housing automatically positions the transistors in spring-loaded contact with the heat sink and pwb enclosure to insure thermal transfer between the transistors and the heat sink upon the occurrence of heating caused by the transistors and the environment.

DESCRIPTION OF PREFERRED EMBODIMENT

Figure 1:
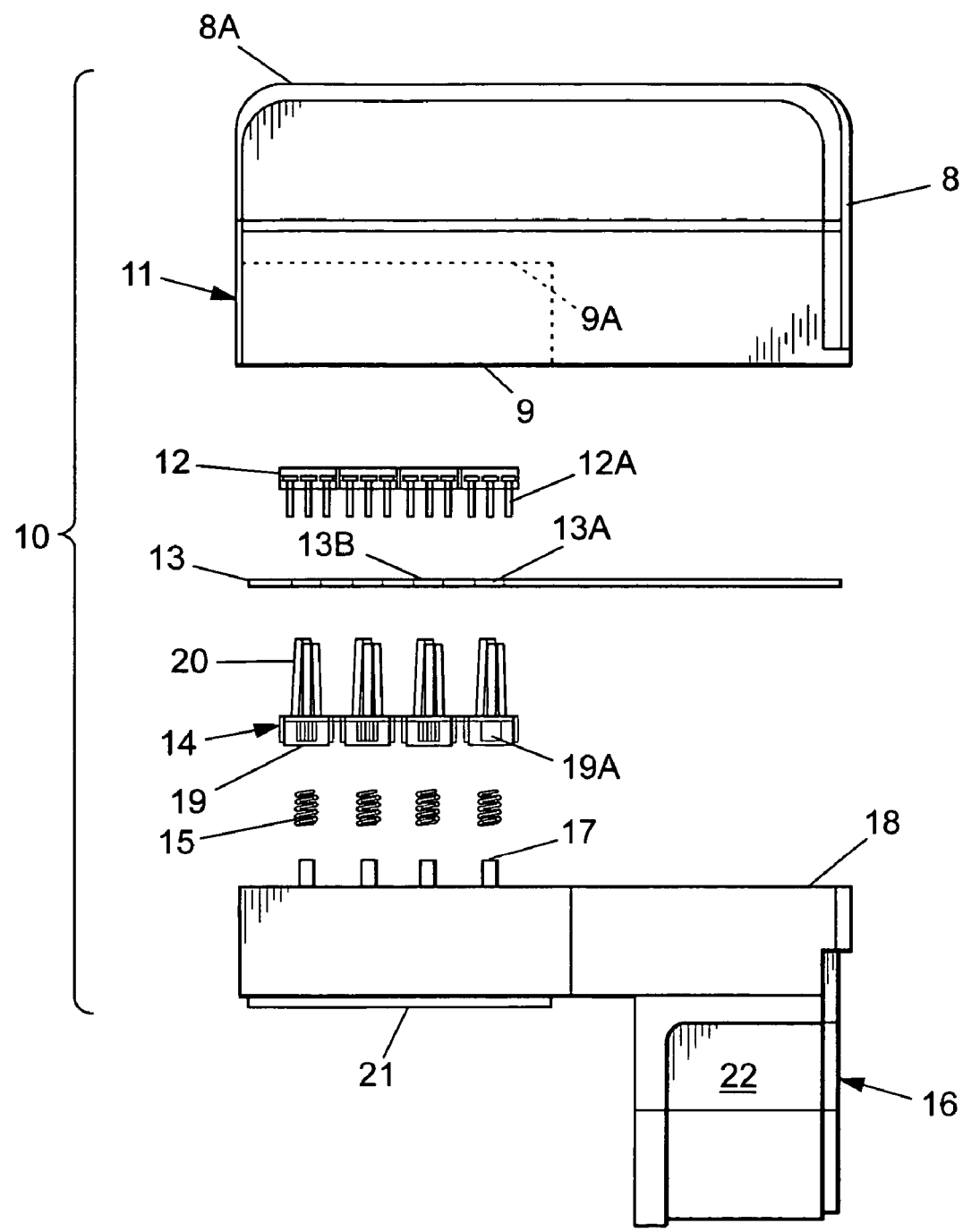
FIG. 1 is a side view of the motor housing assembly of the invention with the combined heat sink-pwb enclosure, transistors, pwb, plunger array and spring array prior to attachment to the motor housing.

The thermally efficient motor housing assembly 10 according to the invention is depicted in FIG. 1 and includes a heat sink 11, made from a metal having good thermal conductivity such as aluminum, in the shape of a hollow cylinder 8 with integral cooling fins 8A, and a bottom plate 9, having an inset 9A, for attachment with a motor housing 16.

The motor housing is a conventional housing of the type that includes a bottom surface 21 for attaching a stepper motor (not shown) along with an enclosure 22 for housing electrical components and connectors (not shown).

The motor housing is adapted to include spring retainer posts 17 extending from the top surface 18 thereof.

An array of transistors 12, having depending connector pins 12A, is positioned under the heat sink 11 and arranged for connection with the pwb 13 via first openings 13A.

An array of plungers 14, in the form of head caps 19, which include recesses 19A and tapered posts 20, is positioned under the pwb 13 such that the tapered posts align with second openings 13B in the pwb for contacting the transistors 12 in the manner to be described below in greater detail.

An array of compression springs 15 is positioned intermediate the plungers 14 and the motor housing 16 such that the springs 15 align with the recesses 19A in the head caps 19 and the posts 17 extending upward from the top 18 of the motor housing 16.

Once the transistors 12 are attached to the pwb 13, the heat sink 11 is then moved in the down-ward indicated direction for connection with the motor housing 16.

During the assembly of the heat sink to the motor housing; the inset 9A within the bottom 9 of the heat sink 11 contacts the transistors 12 on the pwb 13 and moves the pwb into contact with the plungers 14 such that the tapered posts 20 pass thru the second openings 13B and into contact with the transistors 12 to force the transistors into contact with the inset 9A on the bottom plate 9 of the heat sink 11.

The springs 15 become captured within the recesses 19A formed in the ends of head caps 19, and positioned over the posts 17 extending from the top 18 of the motor housing 16.

The heat sink 11 is then fixedly attached to the motor housing 16 by means of metal fasteners (not shown).

Figure 2:
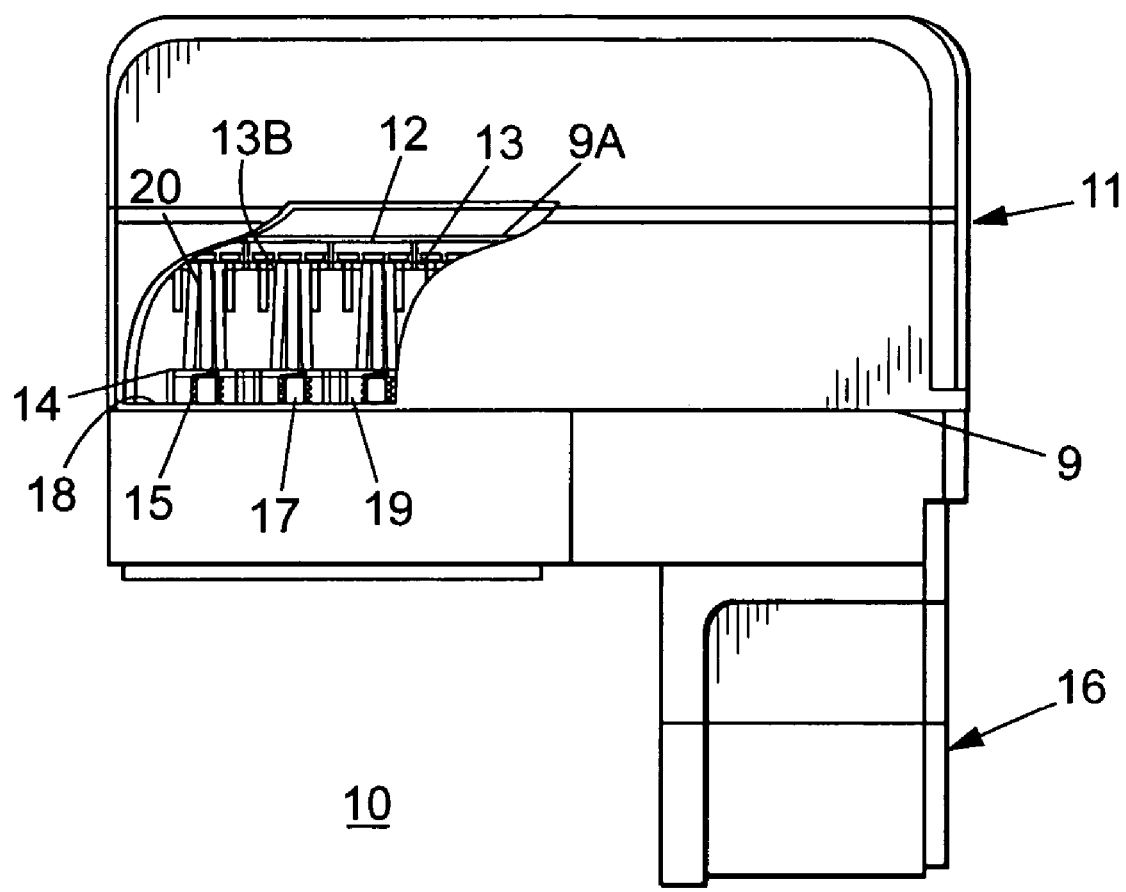
FIG. 2 is side view of the motor housing assembly of FIG. 1 after attachment of the combined heat sink-pwb enclosure, transistors, pwb, plunger array and spring array to the motor housing.

The arrangement between the heat sink 11 and motor housing 16 within the completed thermally efficient motor housing assembly 10 of the invention is best seen by now referring to FIG. 2.

The positioning of the springs 15 over the posts 17, extending from the top surface 18 of the motor housing 16, and the capture of the springs within head caps 19 of plungers 14 fixedly holds the tapered posts 20 against the transistors 12 via second openings 13B in the pwb 13 to force the transistors into good thermal contact with the inset 9A on bottom plate 9 of the heat sink 11 under a wide range of operating temperatures.

A thermally efficient motor housing assembly wherein the power transistors on the motor control pwb are held in good thermal contact with the associated heat sink has herein been described. Although the invention has been described for use with electric motors, it is understood that other types of electrical equipment utilizing heat sinks, power transistors and pwbs can also be employed.

What is claimed is:

1. A method for attaching a heat sink to an electrical apparatus housing comprising the steps of:

providing means on an electrical apparatus housing for supporting a spring;

arranging a first end of a plunger in contact with said spring;

positioning a printed wire board containing a power transistor proximate a second end of said plunger opposite said first end, wherein the second end of the plunger is tapered;

attaching a heat sink to said electrical apparatus housing whereby said power transistor is held against said heat sink by means of said spring and said plunger;

providing an opening in said printed wire board; and inserting said second end of said plunger thru said opening.

2. The method of claim 1 wherein said spring comprises a compression spring.

* * * * *